(12) United States Patent
Yu et al.

(10) Patent No.: US 6,372,572 B1
(45) Date of Patent: Apr. 16, 2002

(54) METHOD OF PLANARIZING PERIPHERAL CIRCUIT REGION OF A DRAM

(75) Inventors: Chih-Hsing Yu; Dahcheng Lin, both of Hsinchu (TW)

(73) Assignee: Taiwan Semiconductor Manufacturing Co., LTD, Hsinchu (TW)

( * ) Notice: Subject to any disclaimer, the term of this patent is extended or adjusted under 35 U.S.C. 154(b) by 0 days.

(21) Appl. No.: 09/802,461

(22) Filed: Mar. 9, 2001

(51) Int. Cl.⁷ .......................................... H01L 21/8242
(52) U.S. Cl. .................. 438/241; 438/253; 438/254; 438/255; 438/396; 438/397; 438/398
(58) Field of Search ................. 438/241, 258, 438/253–256, 396–399

(56) References Cited

U.S. PATENT DOCUMENTS

| | | | |
|---|---|---|---|
| 5,858,831 A | * | 1/1999 | Sung .......................... 438/241 |
| 6,077,738 A | * | 6/2000 | Lee et al. .................... 438/241 |
| 6,143,596 A | * | 11/2000 | Wang .......................... 438/238 |
| 6,177,307 B1 | * | 1/2001 | Tu et al. ...................... 438/241 |
| 6,200,850 B1 | * | 3/2001 | Wu .............................. 438/241 |
| 6,255,160 B1 | * | 7/2001 | Huang ......................... 438/253 |
| 6,258,690 B1 | * | 7/2001 | Zenke .......................... 438/396 |

* cited by examiner

Primary Examiner—John F. Niebling
Assistant Examiner—Jennifer M. Kennedy
(74) Attorney, Agent, or Firm—J. C. Patents

(57) ABSTRACT

A method of planarizing the peripheral circuit region of a DRAM. A first oxide layer and a silicon nitride layer are sequentially formed over a substrate. A plurality of polysilicon plugs are formed within the crown-shaped capacitor region of the DRAM. A patterned second oxide layer is formed over the silicon nitride layer. A conformal doped amorphous silicon layer is formed over the exposed surface of the crown-shaped capacitor region and the peripheral circuit region of the DRAM. A photoresist layer is formed over the crown-shaped region and then a nitrogen implant is carried out to form a silicon oxy-nitride barrier layer. A chemical-mechanical polishing is carried out to separate the various lower electrodes. The photoresist layer and the second oxide layer within the crown-shaped capacitor region are removed. Hemispherical silicon grains are grown on the exposed surface of the doped amorphous silicon layer. A dielectric layer and an upper electrode layer are sequentially formed over the hemispherical silicon grains on the doped amorphous silicon layer.

18 Claims, 10 Drawing Sheets

METHOD OF PLANARIZING PERIPHERAL CIRCUIT REGION OF A DRAM

BACKGROUND OF THE INVENTION

1. Field of Invention

The present invention relates to a method of manufacturing dynamic random access memory (DRAM). More particularly, the present invention relates to a method of planarizing the peripheral circuit region of advanced DRAM.

2. Description of Related Art

FIGS. 1A through 1G are schematic cross-sectional views showing the progression of steps for producing a conventional crown-shaped capacitor in 0.21/0.18 μm DRAM. First, as shown in FIG. 1A, a silicon oxide layer 101 and a silicon nitride layer 102 are sequentially formed over a substrate 100. After polysilicon plugs 104 are formed in the silicon nitride layer 102 and the silicon oxide layer 101, a patterned silicon oxide layer 106 is formed over the silicon nitride layer 102. As shown in FIG. 1B, a conformal doped amorphous silicon layer 108 is formed over the exposed silicon nitride layer 102 and the silicon oxide layer in the crown-shaped capacitor region 120. The doped amorphous silicon layer 108 also covers the silicon oxide layer 106 in the peripheral circuit region 122. As shown in FIG. 1C, a photo resist (PR) layer 110 is formed filling the crown-shaped capacitor region 120 and the peripheral circuit region 122. The PR layer 110 protects a portion of the doped amorphous silicon layer 108 in a subsequent operation. As shown in FIG. 1D, chemical-mechanical polishing is carried out to polish the PR layer 110 and to remove a portion of the doped amorphous silicon layer 108, thereby forming the lower electrodes 112 of various capacitors that are separated from each other. As shown in FIG. 1E, after removal of the PR layer 110, the silicon oxide layer 106 is recessed by performing a wet chemical etch process. Simultaneously, the remaining portion of the oxide layer 106 in the peripheral circuit region 122 is also removed. As shown in FIG. 1F, hemispherical silicon grains 114 are sequentially formed on the sidewalls of the lower electrodes 112. Hence, the exposed surface area of the lower electrodes 112 is increased. As shown in FIG. 1G, an ONO/NO dielectric layer 116 is formed over the lower electrodes 114 and the silicon nitride layer 102. Lastly, a conductive layer 118 is formed over the dielectric layer 116 to form the upper electrode of the capacitor, thereby completing the fabrication of a conventional crown-shaped DRAM capacitor.

As shown in FIG. 1G, there is a height difference of about 8000 Å to 10000 Å between the lower electrodes 112 in the crown-shaped capacitor region 120 and the silicon nitride layer 102 in the peripheral circuit region 122. Hence, planarizing the deposited upper electrode layer 118 and the peripheral circuit region 122 is difficult, and thereby produces a poor foundation for forming the desired devices in subsequent steps.

SUMMARY OF THE INVENTION

Accordingly, one object of the present invention is to provide a method of planarizing the peripheral circuit region of an advanced DRAM. Nitrogen is implanted into the silicon dioxide layer in the peripheral circuit region to form a silicon oxy-nitride layer. The silicon oxy-nitride layer serves as a protective layer shielding the silicon dioxide layer in the peripheral circuit region from the subsequent chemical-mechanical polishing and silicon oxide layer removal. The silicon oxy-nitride layer also forms a platform in the peripheral circuit production.

A second object of this invention is to provide a method of planarizing the peripheral circuit region of an advanced DRAM that can be easily implemented.

To achieve these and other advantages, and in accordance with the purpose of the invention, as embodied and broadly described herein, the invention provides a method of planarizing the peripheral circuit region of an advanced DRAM. By implanting nitrogen into a silicon dioxide layer to form a silicon oxy-nitride layer, the problem caused by the planarization of the peripheral circuit region is thus solved.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1A:
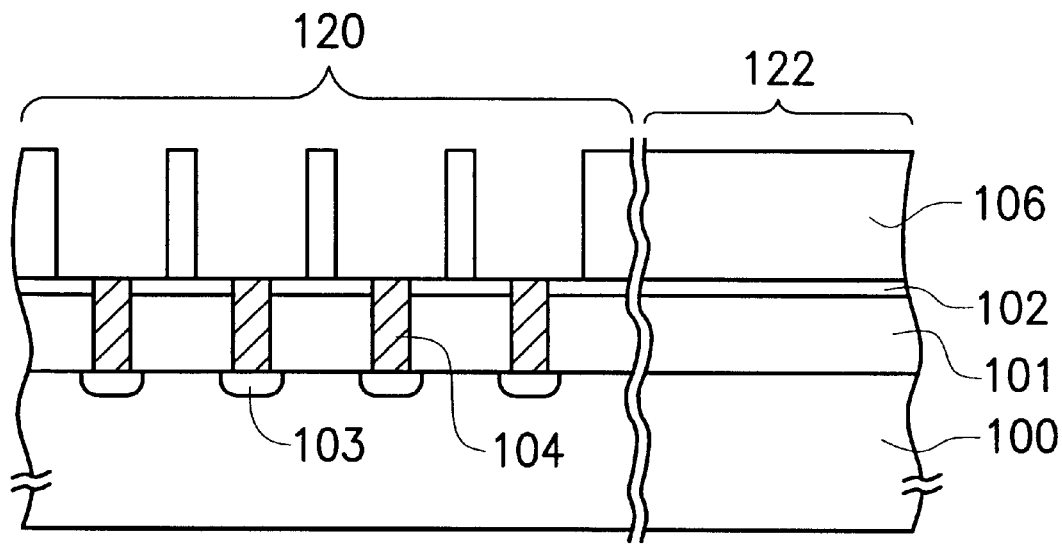
FIGS. 1A through 1G are schematic cross-sectional views showing the progression of steps for producing a conventional crown-shaped capacitor in DRAM.
Figure 1B:
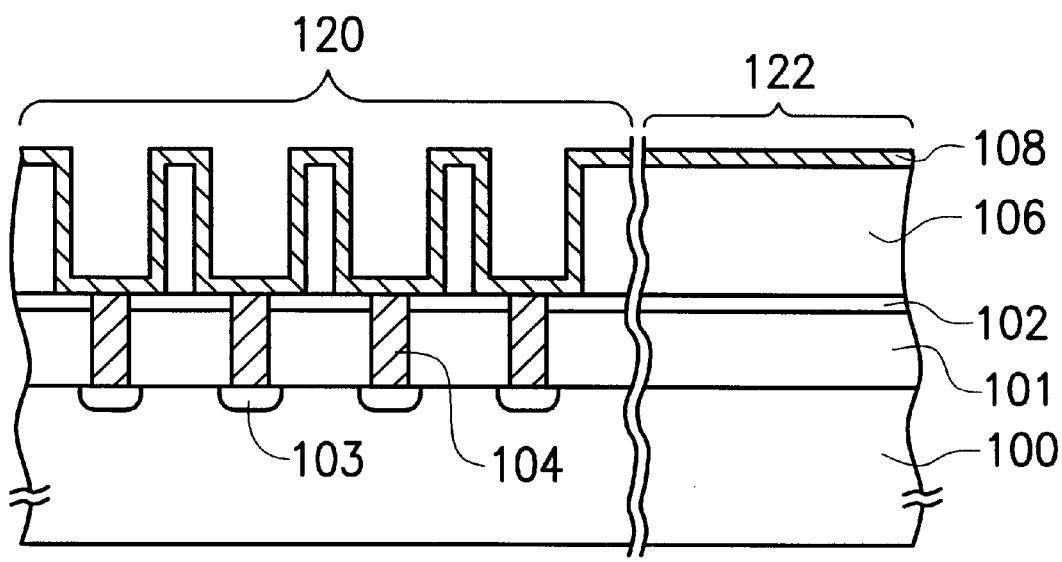
Figure 1C:
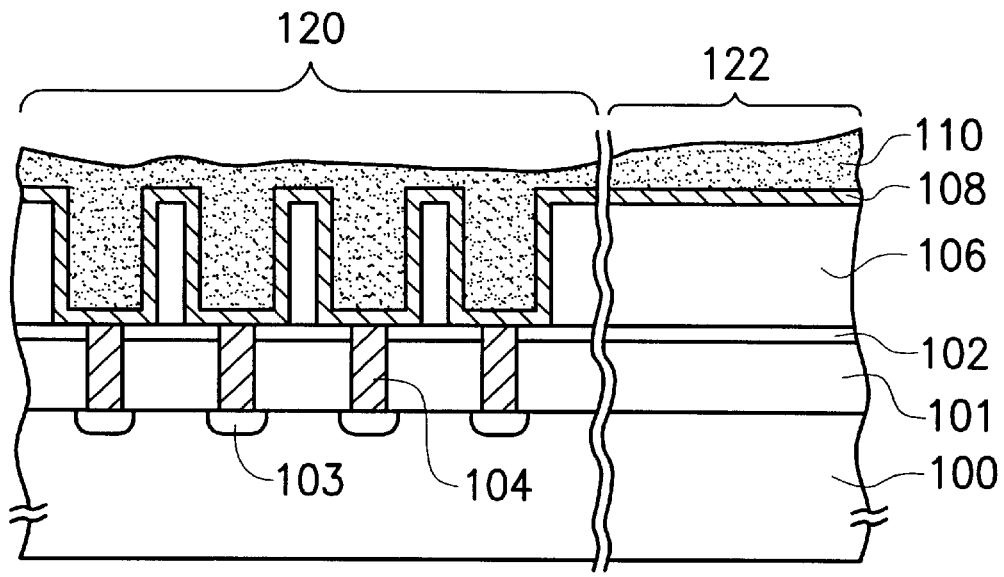
Figure 1D:
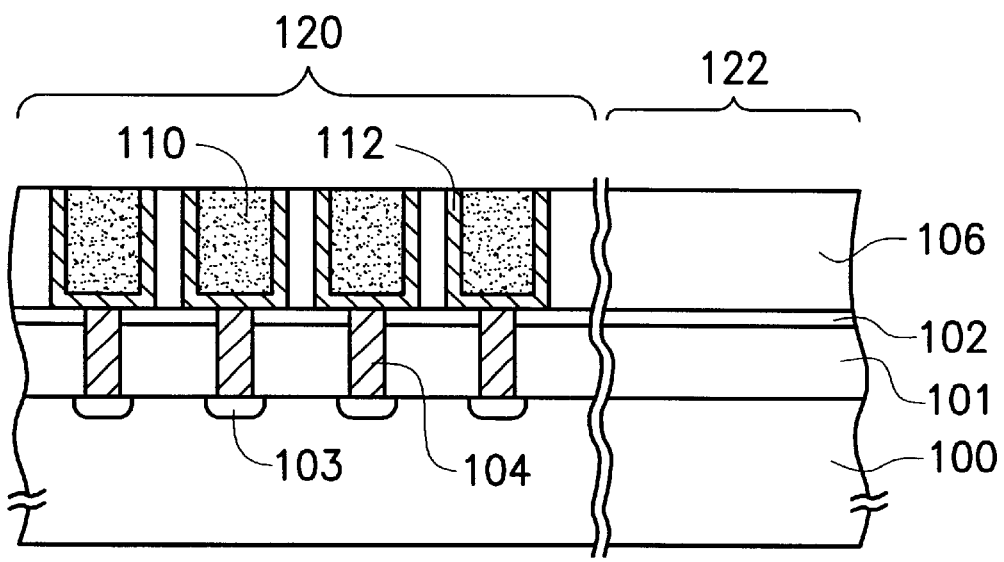
Figure 1E:
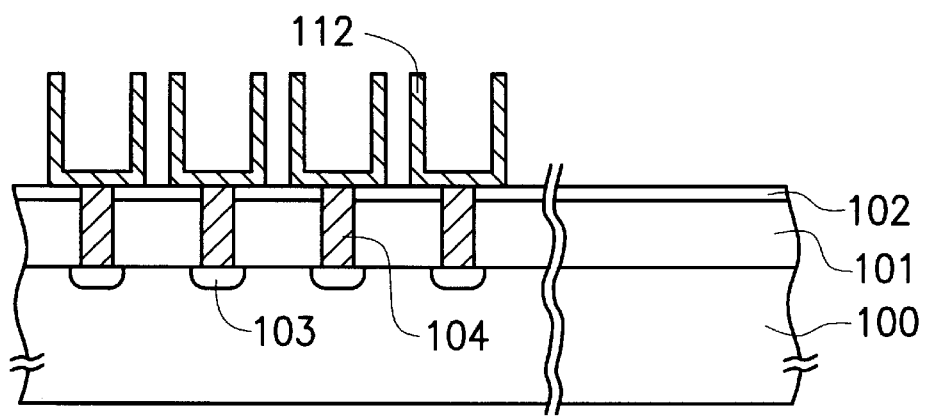
Figure 1F:
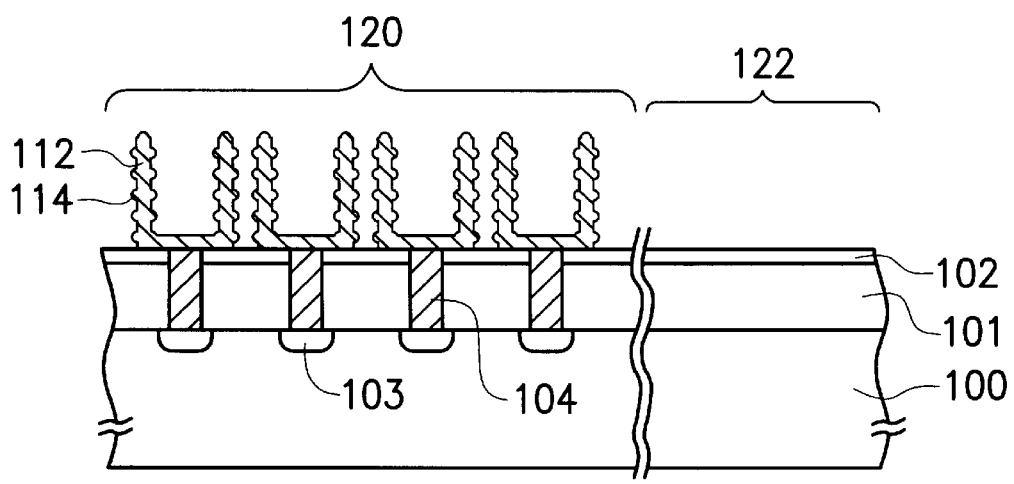
Figure 1G:
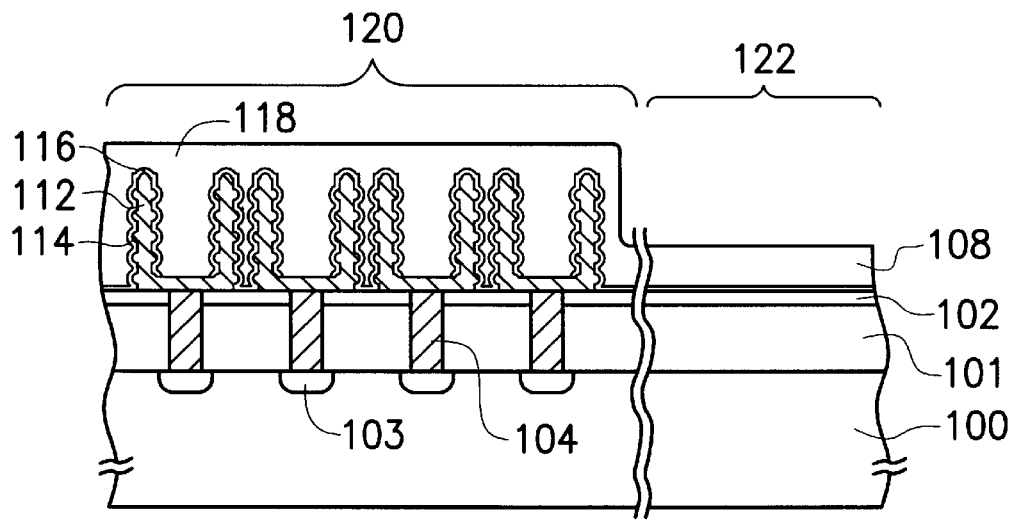

Reference will now be made in detail to the present preferred embodiments of the invention, examples of which are illustrated in the accompanying drawings. Wherever possible, the same reference numbers are used in the drawings and the description to refer to the same or like parts.

FIGS. 2A through 2H are schematic cross-sectional views showing the progression of steps for planarizing the peripheral circuit region in an advanced DRAM according to a first preferred embodiment of this invention.

Figure 2A:
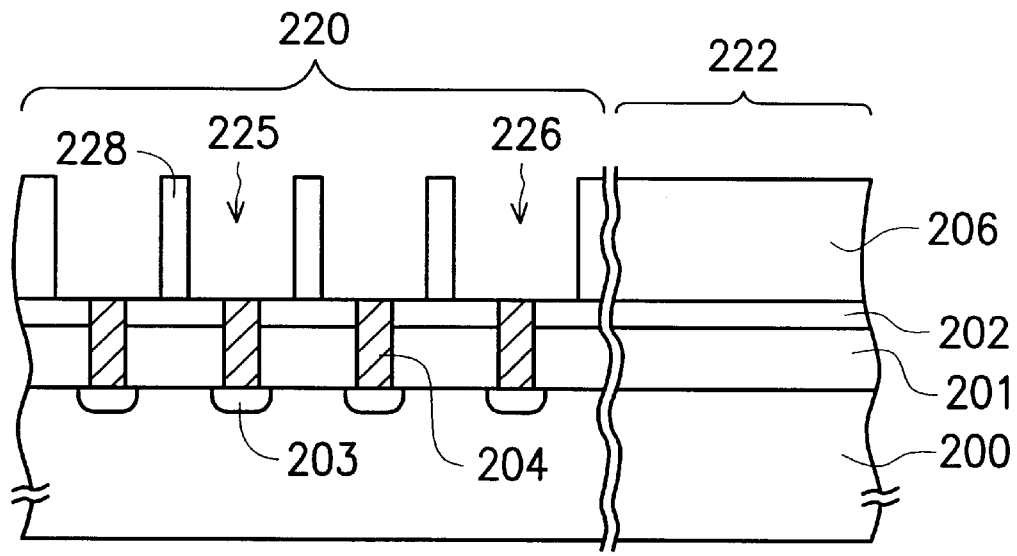
FIGS. 2A through 2H are schematic cross-sectional views showing the progression of steps for planarizing the peripheral circuit region in an advanced DRAM according to a first preferred embodiment of this invention.

First, as shown in FIG. 2A, a silicon oxide layer 201 and a silicon nitride layer 202 are sequentially formed over a substrate 200. A plurality of polysilicon plugs 204 are formed in the silicon oxide layer 201 and the silicon nitride layer 202 within the crown-shaped capacitor region 220. A patterned silicon oxide layer 206 having a thickness of about 8000 Å to 15000 Å is formed over the silicon nitride layer 202. Consequently, a plurality of crown-shaped structures 228 and opening regions 225 and 226 are formed within the crown-shaped capacitor region 220. Located nearest the peripheral circuit region 222 the opening 226 within the crown-shaped capacitor region 220 is wider than the openings 225. Hence, the edge of the deposited photoresist layer lands on a wider opening region rather than on the silicon oxide layer 206 within the peripheral circuit region 222. In this arrangement, the silicon oxide layer 206 within the peripheral circuit region 222 will be completely covered by a silicon oxy-nitride layer after a nitrogen implant.

Figure 2B:
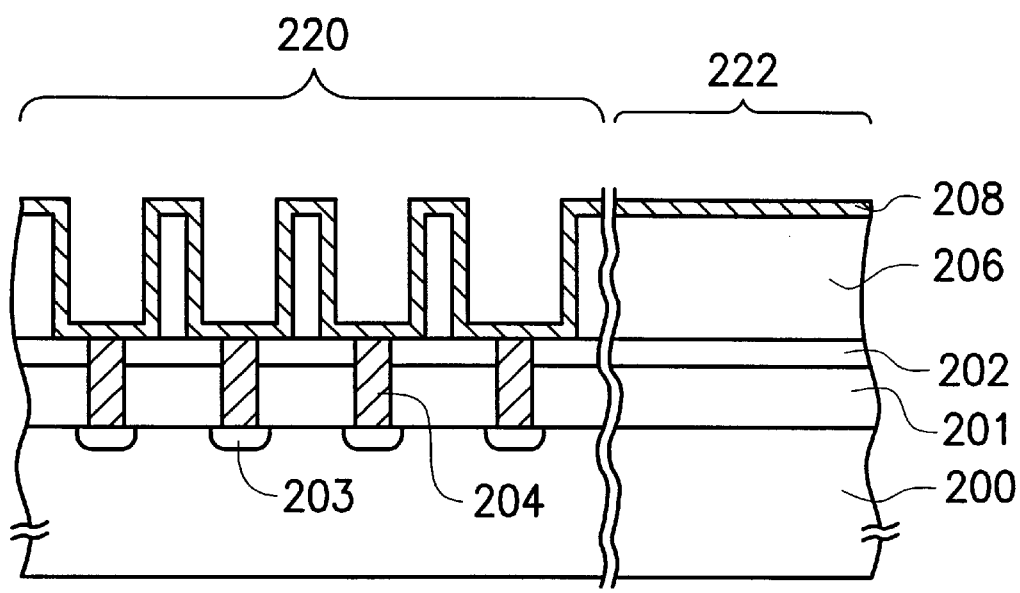

As shown in FIG. 2B, a conformal doped amorphous silicon layer 208 is formed over the silicon oxide layer 206, the exposed silicon nitride layer 202 and the polysilicon plugs 204 in the crown-shaped capacitor region 220. The doped amorphous silicon layer 208 also covers the silicon oxide layer 206 in the peripheral circuit region 222. The doped amorphous silicon layer 208 has a thickness of about 200 Å to 1000 Å.

Figure 2C:
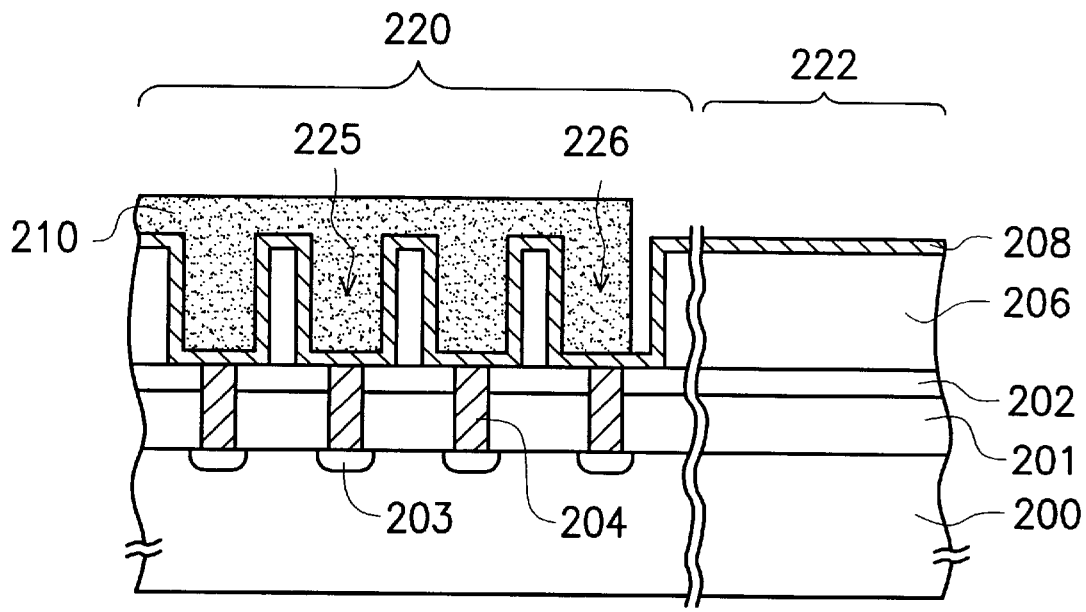

As shown in FIG. 2C, a patterned photoresist layer 210 is formed over the doped amorphous silicon layer 208, thereby filling the openings 225 and partially filling the opening region 226 formed in the crown-shaped capacitor region 220. The photoresist layer 210 protects the doped amorphous silicon layer 208 in the subsequent device isolation process. Note that the photoresist material over the peripheral circuit region 222 has already been removed by photolithographic and etching processes.

Figure 2D:
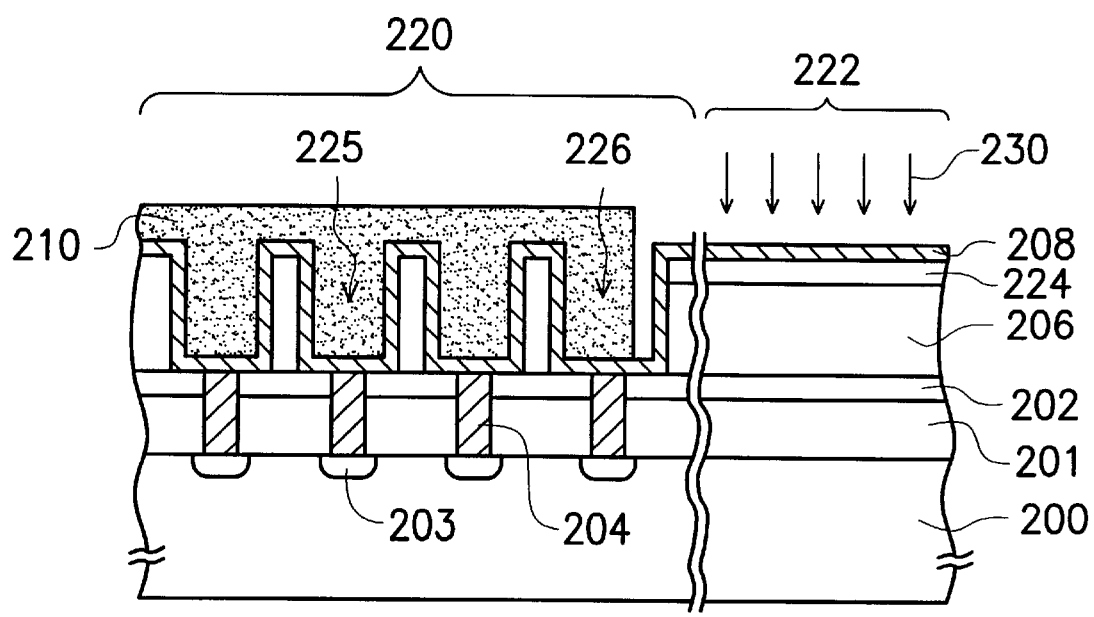

As shown in FIG. 2D, a nitrogen implantation at a temperature of about 530° C. is carried out. Since the crown-shaped capacitor region 220 is protected by the photoresist layer 210, nitrogen implantation has little effect on the layers below photoresist layer 210.

Figure 2E:
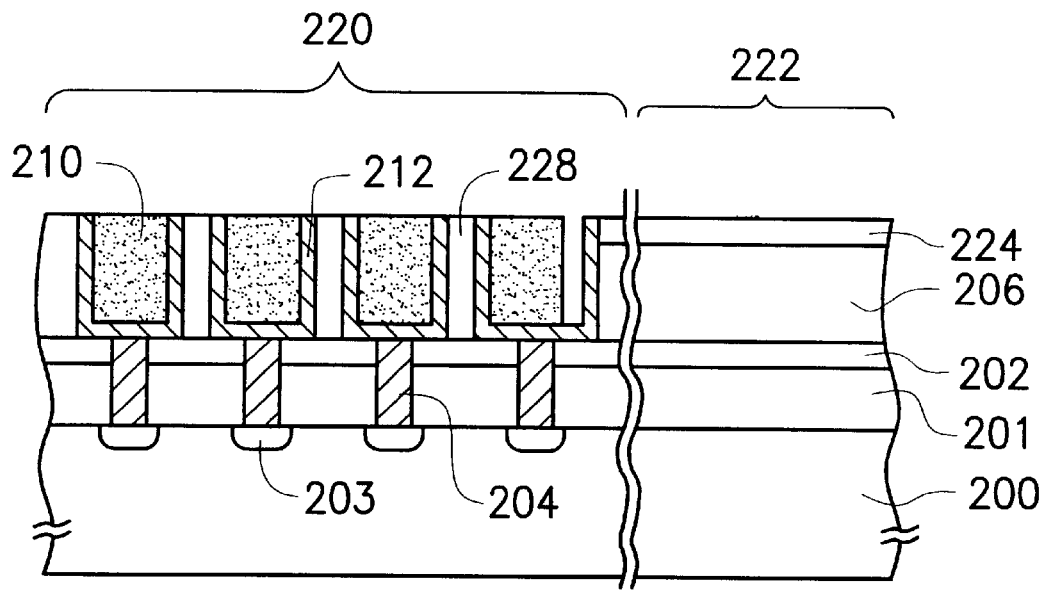

As shown in FIG. 2E, a portion of the photoresist layer 210 and a portion of the doped amorphous silicon layer 208 are removed by performing a chemical-mechanical polishing process until the silicon oxy-nitride layer 224 in the peripheral circuit region 222 is exposed. As a result, remaining portions of the silicon oxide layer 206 form a silicon oxide layer 228 that separates the various lower electrodes 212 in the crown-shaped capacitor region 220.

Figure 2F:
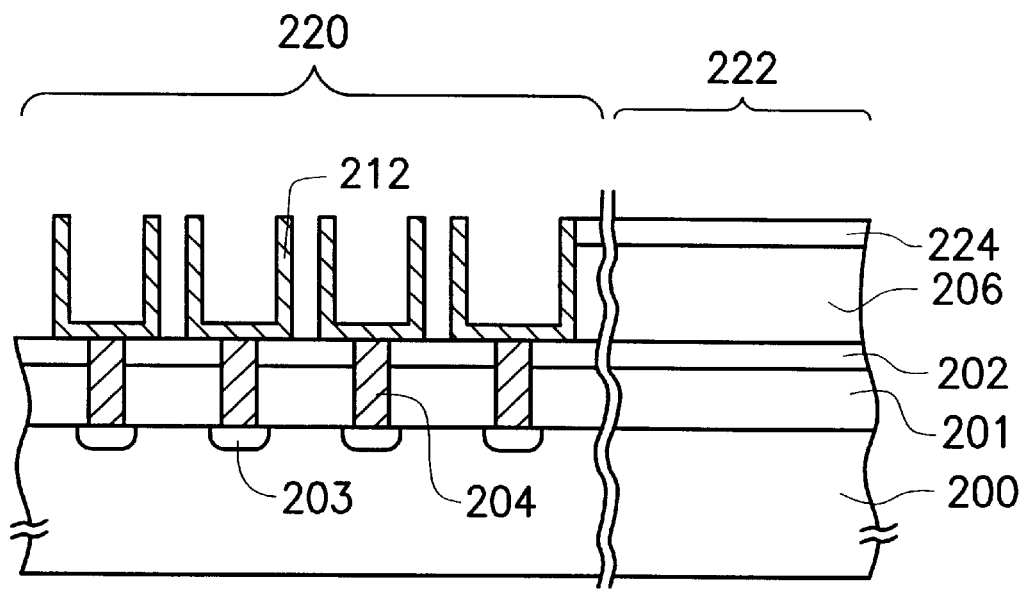

As shown in FIG. 2F, the PR layer 210 is removed by $O_2$ asher and a mixture of $H_2SO_4$ and $H_2O$. Also, DHF or EF steam is used to remove the remaining silicon oxide layer 228 between the lower electrodes 212 within the crown-shaped capacitor region 220. Hence, the lower electrodes 212 are exposed. Since the silicon oxide layer 206 in the peripheral circuit region 222 is covered by the silicon oxy-nitride layer 224, the oxide layer 206 remains intact during the oxide removal process.

Figure 2G:
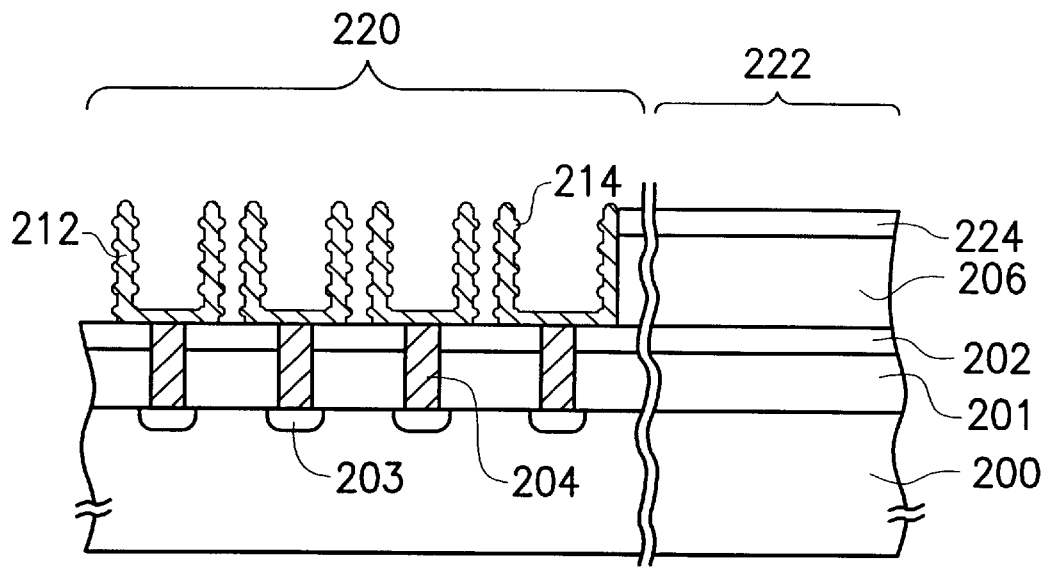
Figure 2H:
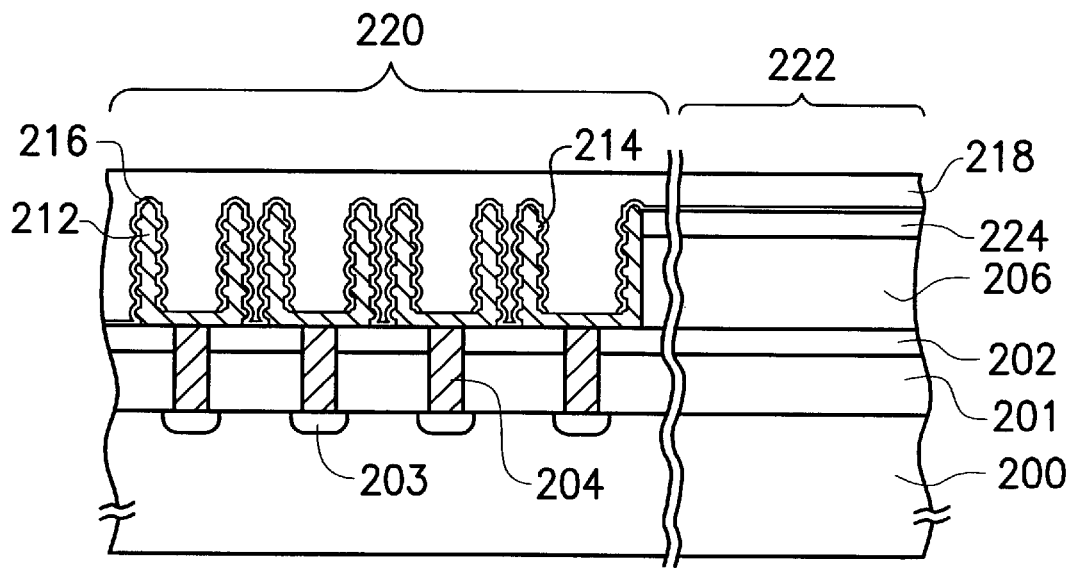

As shown in FIG. 2G, hemispherical silicon grains 214 are selectively grown on the exposed lower electrodes 212 under extra-high vacuum system (about $10^{-8}$ torr) so that exposed surface area of each lower electrode 212 is increased. Hence, capacitance of the ultimately formed capacitor is raised.

Finally, as shown in FIG. 2I, a conformal dielectric layer 216 such as an ONO or a NO layer is formed over the lower electrodes 212 and the silicon oxy-nitride layer 224. A conductive layer such as a polysilicon layer is formed, thereby forming the upper electrode 218 of the capacitor. Thus, the openings between the lower electrodes 212 are filled and the silicon oxy-nitride layer 224 is covered.

FIGS. 3A through 3G are schematic cross-sectional views showing the progression of steps for planarizing the peripheral circuit region in an advanced DRAM, according to a second preferred embodiment of this invention.

Figure 3A:
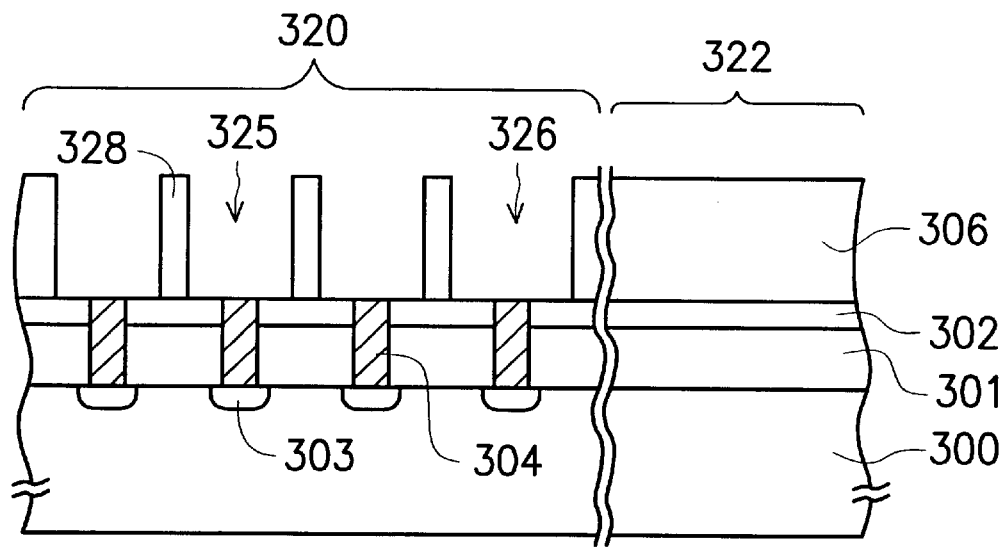
FIGS. 3A through 3G are schematic cross-sectional views showing the progression of steps for planarizing the peripheral circuit region in an advanced DRAM according to a second preferred embodiment of this invention.

First, as shown in FIG. 3A, a silicon oxide layer 301 and a silicon nitride layer 302 are sequentially formed over a substrate 300. A plurality of polysilicon plugs 304 are formed in the silicon oxide layer 301 and the silicon nitride layer 302 within the crown-shaped capacitor region 320. A patterned silicon oxide layer 306 having a thickness of about 8000 Å to 15000 Å is formed over the silicon nitride layer 302. Consequently, a plurality of crown-shaped structures 328 and opening regions 325 and 326 are formed within the crown-shaped capacitor region 320. Located nearest the peripheral circuit region 322, the opening 326 within the crown-shaped capacitor region 320 is wider than openings 325. Hence, the edge of the subsequently deposited photoresist layer lands on a wider opening region rather than the silicon oxide layer 306 within the peripheral circuit region 322. In this arrangement, the silicon oxide layer 306 within the peripheral circuit region 322 will be completely covered by a silicon oxy-nitride layer after a nitrogen implant.

Figure 3B:
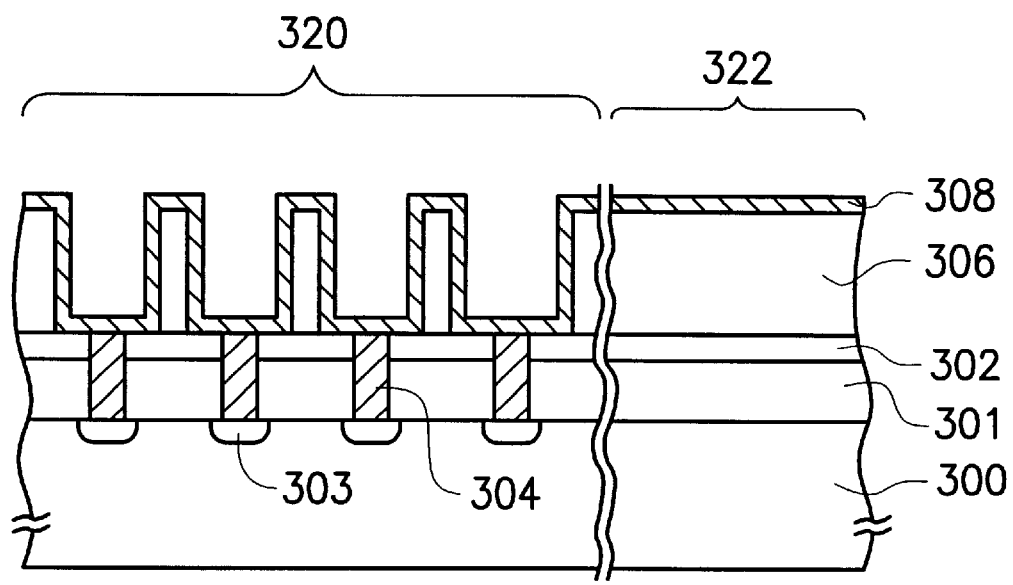

As shown in FIG. 3B, a conformal doped amorphous silicon layer 308 is formed over the silicon oxide layer 306, the exposed silicon nitride layer 302 and the polysilicon plugs 304 in the crown-shaped capacitor region 320. The doped amorphous silicon layer 308 also covers the silicon oxide layer 306 in the peripheral circuit region 322. The doped amorphous silicon layer 308 has a thickness of about 200 Å to 1000 Å. The exposed surface of the doped amorphous silicon layer 308 is roughened to increase surface area of the layer, so that each lower electrode has a larger effective surface area after a subsequent process.

Figure 3C:
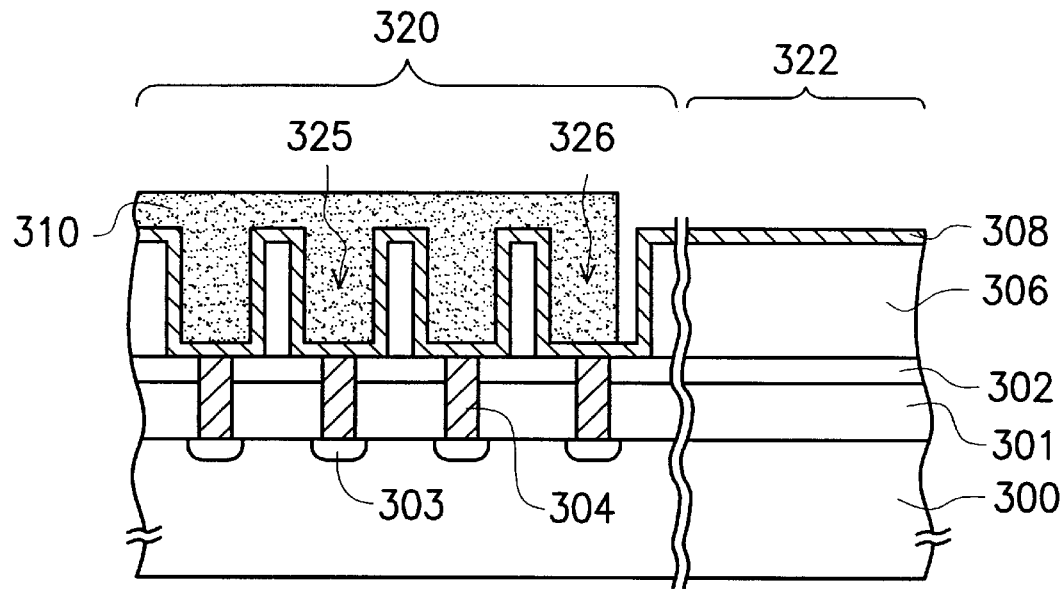

As shown in FIG. 3C, a patterned photoresist layer 310 is formed over the doped amorphous silicon layer 308, thereby filling the openings 325 and partially filling the opening region 326 that were formed by the crown-shaped structure 328. The photoresist layer 310 protects the doped amorphous silicon layer 308 in the subsequent device isolation process. Note that the photoresist material over the peripheral circuit region 322 has already been removed by photolithographic and etching processes.

Figure 3D:
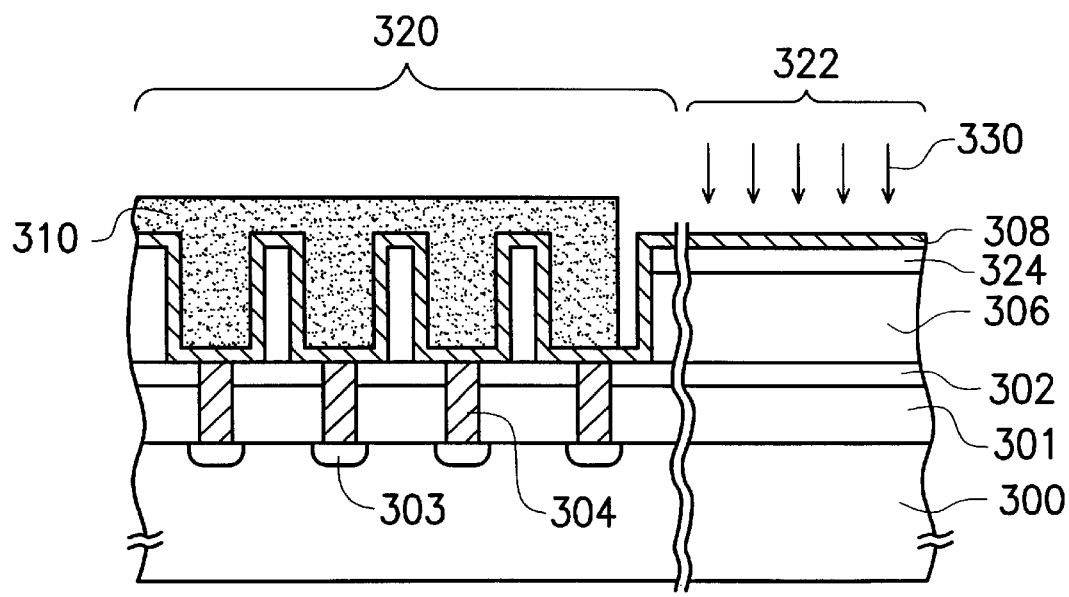

As shown in FIG. 3D, a nitrogen implantation process at a temperature above about 530° C. is carried out. Since the crown-shaped capacitor region 320 is protected by the photoresist layer 310, nitrogen implantation has little effect on the layers below photoresist layer 310. Because the surface of the doped amorphous silicon layer 308 has already been roughened, there is no need to grow hemispherical silicon grains (HSG) over its surface. Hence, a temperature greater than about 530° C. is permitted in the nitrogen ion implantation process.

Figure 3E:
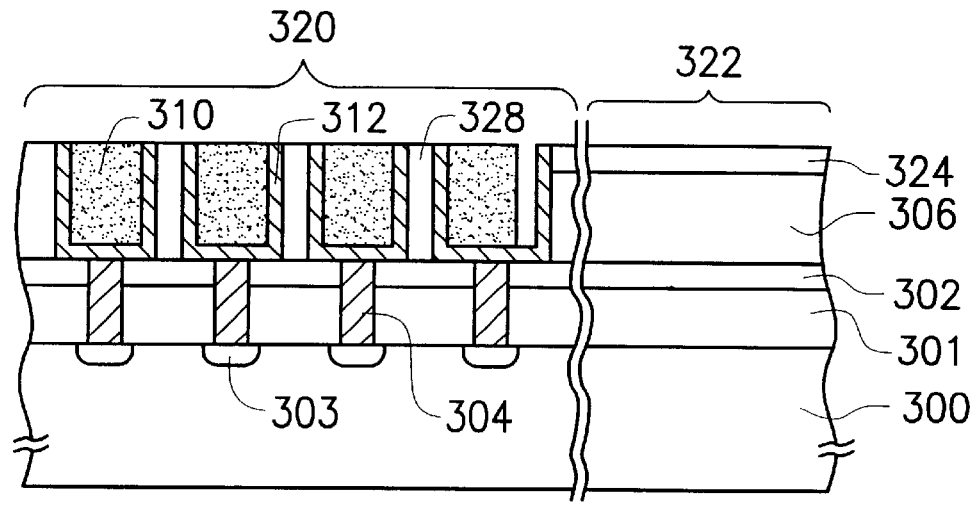

As shown in FIG. 3E, a portion of the photoresist layer 310 and a portion of the doped amorphous silicon layer 308 are removed by chemical-mechanical polishing until the silicon oxy-nitride layer 324 in the peripheral circuit region 322 is exposed. As a result, remaining portions of the silicon oxide layer 306 form a silicon oxide layer 328 that separates the various lower electrodes 312 in the crown-shaped capacitor region 320.

Figure 3F:
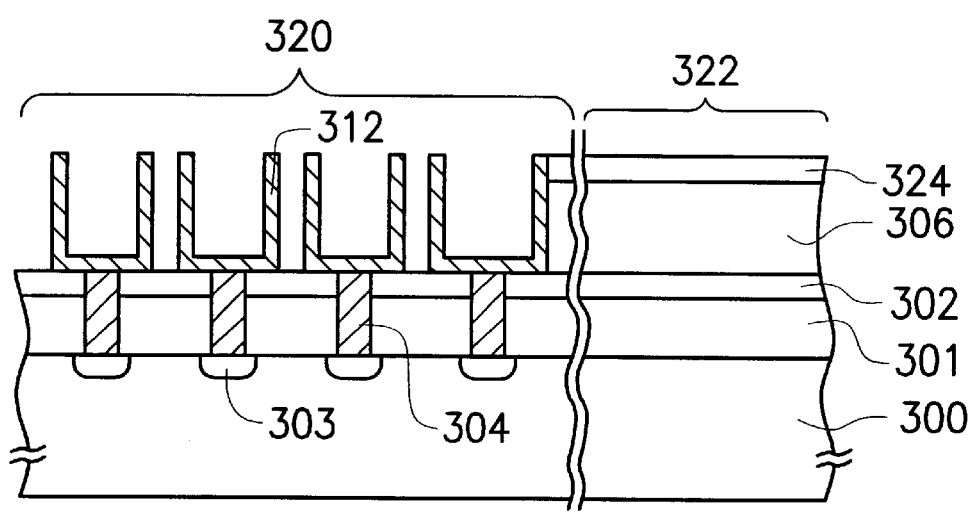

As shown in FIG. 3F, the PR layer 310 is removed by $O_2$ asher and a mixture of $H_2SO_4$ and $H_2O$. Also, DHF steam or HF steam is used to remove the silicon oxide layer 328 between the lower electrodes 312 within the crown-shaped capacitor region 320. Hence, the lower electrodes 312 are exposed. Since the silicon oxide layer 306 in the peripheral circuit region 322 is covered by the silicon oxy-nitride layer 324, the oxide layer 306 remains intact after the photoresist and oxide removal processes.

Figure 3G:
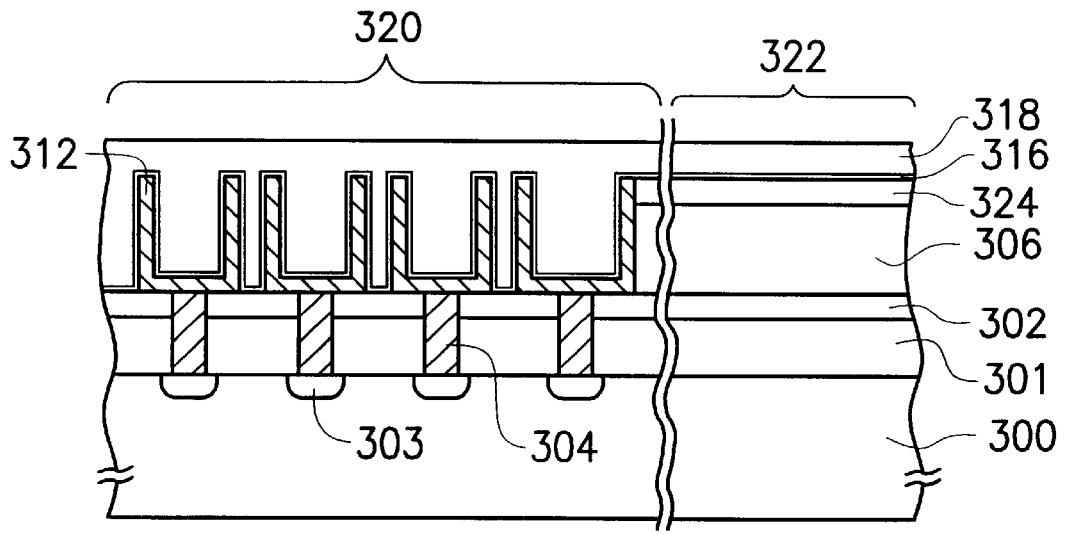

As shown in FIG. 3G, a conformal dielectric layer 316 such as an ONO or a NO layer is formed over the lower electrodes 312 and the silicon oxy-nitride layer 324. A conductive layer such as a polysilicon layer is formed, thereby forming the upper electrode 318 of the capacitor. Thus, the openings between the lower electrodes 312 are filled and the silicon oxy-nitride layer 324 is covered.

In summary, due to the presence of the protective silicon oxy-nitride layer (224 or 324) when the crown-shaped region (220 or 320) is formed, a portion of the silicon oxide layer (206 or 306) is retained. Hence, height different between the crown-shaped region (220 or 320) and the peripheral circuit region (222 or 322) is reduced considerably, thereby facilitating the subsequent production of peripheral circuits and devices over the peripheral circuit region.

It will be apparent to those skilled in the art that various modifications and variations can be made to the structure of the present invention without departing from the scope or spirit of the invention. In view of the foregoing, it is intended that the present invention covers modifications and variations of this invention, provided that they fall within the scope of the following claims and their equivalents.

What is claimed is:

1. A method of planarizing a peripheral circuit region of dynamic random access memory (DRAM), comprising:
   providing a substrate,
   forming a first oxide layer over the substrate;
   forming a stopping layer over the first oxide layer;
   forming a plurality of polysilicon plugs that pass through the first oxide layer and the stopping layer;
   depositing a second oxide layer over the stopping layer and the polysilicon plugs;
   patterning the second oxide layer to form openings that expose the polysilicon plugs and a portion of the stopping layer around the plug, thereby forming a crown-shaped capacitor region and a peripheral circuit region;
   forming a conformal doped amorphous silicon layer over the exposed polysilicon plug, the stopping layer and the second oxide layer;
   depositing photoresist material to form a photoresist layer over the crown-shaped capacitor region;
   implanting nitrogen into the peripheral circuit region to form a silicon oxy-nitride layer over the second oxide layer;
   performing a chemical-mechanical polishing to expose a portion of the doped amorphous silicon layer so that a plurality of lower electrodes are separated from each other;
   removing a portion of the second oxide layer and a portion of the photoresist layer within the crown-shaped capacitor region;
   growing hemispherical silicon grains over the exposed surface of the lower electrodes;
   forming a dielectric layer over the hemispherical grain-covered lower electrodes and the silicon oxy-nitride layer; and
   depositing a conductive material over the dielectric layer to form an upper electrode.

2. The method of claim 1, wherein material forming the stopping layer includes silicon nitride.

3. The method of claim 1, wherein the second oxide layer has a thickness of about 8000 Å to 15000 Å.

4. The method of claim 1, wherein the conformal doped amorphous silicon layer has a thickness of about 200 Å to 1000 Å.

5. The method of claim 1, wherein the step of implanting nitrogen includes implanting nitrogen a temperature of about 530° C.

6. The method of claim 1, wherein the step of removing a portion of the photoresist layer includes using $O_2$ asher and a mixture of $H_2SO_4$ and $H_2O$.

7. The method of claim 1, wherein the step of removing a portion of the second oxide layer and the photoresist layer includes using DHF or HF steam.

8. The method of claim 1, wherein the step of forming the dielectric layer includes depositing nitride and oxide in sequence to form a nitride/oxide (NO) composite layer or depositing oxide, nitride and oxide in sequence to form an oxide/nitride/oxide (ONO) composite layer.

9. The method of claim 1, wherein the step of forming the upper electrode includes depositing polysilicon.

10. A method of planarizing a peripheral circuit region of an dynamic random access memory (DRAM), comprising:
    providing a substrate;
    forming a first oxide layer over the substrate;
    forming a stopping layer over the first oxide layer;
    forming a plurality of polysilicon plugs that pass through the first oxide layer and the stopping layer;
    depositing a second oxide layer over the stopping layer and the polysilicon plugs;
    patterning the second oxide layer to form openings that expose the polysilicon plugs and a portion of the stopping layer around the plug, thereby forming a crown-shaped capacitor region and a peripheral circuit region;
    forming a conformal doped amorphous silicon layer over the exposed polysilicon plug, the stopping layer and the second oxide layer;
    performing a surface-roughening operation to increase the exposed surface area of the conformal doped amorphous silicon layer;
    depositing photoresist material to form a photoresist layer over the crown-shaped capacitor region;
    implanting nitrogen into the peripheral circuit region to form a silicon oxy-nitride layer over the second oxide layer;
    performing a chemical-mechanical polishing to expose a portion of the doped amorphous silicon layer so that a plurality of lower electrodes are separated from each other;
    removing a portion of the second oxide layer and a portion of the photoresist layer within the crown-shaped capacitor region;
    forming a dielectric layer over the lower electrodes and the silicon oxy-nitride layer; and
    depositing a conductive material over the dielectric layer to form an upper electrode.

11. The method of claim 10, wherein material forming the stopping layer includes silicon nitride.

12. The method of claim 10, wherein the second oxide layer has a thickness of about 8000 Å to 15000 Å.

13. The method of claim 10, wherein the conformal doped amorphous silicon layer has a thickness of about 200 Å to 1000 Å.

14. The method of claim 10, wherein the step of implanting nitrogen includes implanting nitrogen at a temperature above about 500° C.

15. The method of claim 10, wherein the step of removing the photoresist layer includes using $O_2$ asher and a mixture of $H_2SO_4$ and $H_2O$.

16. The method of claim 10, wherein the step of removing the second oxide layer includes using DHF or HF steam.

17. The method of claim 10, wherein the step of forming the dielectric layer includes depositing nitride and oxide in sequence to form a nitride/oxide (NO) composite layer or depositing oxide, nitride and oxide in sequence to form an oxide/nitride/oxide (ONO) composite layer.

18. The method of claim 10, wherein the step of forming the upper electrode includes depositing polysilicon.

* * * * *